United States Patent
Kim et al.

(10) Patent No.: US 10,903,416 B2
(45) Date of Patent: Jan. 26, 2021

(54) ALLOY THIN FILMS EXHIBITING PERPENDICULAR MAGNETIC ANISOTROPY

(71) Applicant: KOREA UNIVERSITY RESEARCH AND BUSINESS FOUNDATION, Seoul (KR)

(72) Inventors: Young Keun Kim, Seoul (KR); Yong Jin Kim, Chungcheongbuk-do (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 496 days.

(21) Appl. No.: 15/599,283

(22) Filed: May 18, 2017

(65) Prior Publication Data
US 2018/0166628 A1    Jun. 14, 2018

(30) Foreign Application Priority Data
Dec. 14, 2016 (KR) .................. 10 2016 0170108

(51) Int. Cl.
| | |
|---|---|
| C23C 14/34 | (2006.01) |
| H01L 43/10 | (2006.01) |
| H01L 43/08 | (2006.01) |
| H01L 43/12 | (2006.01) |
| H01F 10/32 | (2006.01) |

(Continued)

(52) U.S. Cl.
CPC ............. *H01L 43/10* (2013.01); *C23C 14/16* (2013.01); *C23C 14/3464* (2013.01); *H01F 10/3236* (2013.01); *H01F 10/3286* (2013.01); *H01F 41/18* (2013.01); *H01L 43/08* (2013.01); *H01L 43/12* (2013.01); *H01F 10/3272* (2013.01)

(58) Field of Classification Search
CPC ............................. C23C 14/16; C23C 14/3464
See application file for complete search history.

(56) References Cited

U.S. PATENT DOCUMENTS

| | | | |
|---|---|---|---|
| 4,396,557 A | 8/1983 | Smith, Jr. et al. | |
| 8,374,025 B1 * | 2/2013 | Ranjan .................. | B82Y 10/00 365/148 |
| 8,508,984 B2 | 8/2013 | Ranjan et al. | |

(Continued)

FOREIGN PATENT DOCUMENTS

| | | |
|---|---|---|
| JP | S62-60113 A | 3/1987 |
| JP | H07-86038 A | 3/1995 |

(Continued)

OTHER PUBLICATIONS

Restriction Requirement for U.S. Appl. No. 15/599,259 dated May 3, 2019.

(Continued)

*Primary Examiner* — Jason Berman
(74) *Attorney, Agent, or Firm* — Jenkins, Wilson, Taylor & Hunt, P.A.

(57) ABSTRACT

A method for forming a CoFeSiB—Pd alloy thin film exhibiting perpendicular magnetic anisotropy includes: simultaneously sputtering a CoFeSiB target and a Pd target inside a vacuum chamber to form a CoFeSiB—Pd alloy thin film on a substrate disposed inside the vacuum chamber; and annealing the substrate, on which the CoFeSiB—Pd alloy thin film is formed, to exhibit perpendicular magnetic anisotropy.

13 Claims, 12 Drawing Sheets

(51) Int. Cl.
*H01F 41/18* (2006.01)
*C23C 14/16* (2006.01)

(56) References Cited

U.S. PATENT DOCUMENTS

| | | | |
|---|---|---|---|
| 8,852,761 | B2 | 10/2014 | Kim et al. |
| 9,047,881 | B2 | 6/2015 | Edelstein et al. |
| 2004/0247945 | A1* | 12/2004 | Chen .................... G11B 5/667 428/828 |
| 2013/0108889 | A1 | 5/2013 | Piramanayagam et al. |
| 2013/0244058 | A1 | 9/2013 | Kim et al. |
| 2013/0334632 | A1* | 12/2013 | Park .................... H01L 27/224 257/421 |
| 2015/0236071 | A1 | 8/2015 | Lee et al. |
| 2018/0166627 | A1 | 6/2018 | Kim |

FOREIGN PATENT DOCUMENTS

| | | |
|---|---|---|
| JP | 2694110 B2 | 9/1997 |
| JP | 2006-253637 A | 9/2006 |
| JP | 2008-135676 A | 6/2008 |
| JP | 4586040 | 9/2010 |
| JP | 2015-534272 A | 11/2015 |
| JP | 6219395 B2 | 10/2017 |
| JP | 6375414 B2 | 8/2018 |
| KR | 10-1995-0006452 A | 3/1995 |
| KR | 10-2008-0048151 A1 | 6/2008 |
| KR | 10-2011-0083403 A | 7/2011 |
| KR | 101519767 B1 | 5/2015 |
| KR | 101738829 B1 | 5/2017 |

OTHER PUBLICATIONS

Nishimura, et al., "Magnetic tunnel junction device with perpendicular magnetization films for high-density magnetic random access memory," Journal of Applied Physics, vol. 91, No. 8, pp. 5246-5249, Apr. 15, 2002.
Jung, et al., "Effects of Rapid Thermal Annealing on the Magnetic Properties of CoSiB/Pd Multilayers with Perpendicular Anisotrophy," Journal of Korean Physical Society, vol. 65, No. 1, pp. 65-69, Jul. 2014.
Gusev et al., "Effect of thermal annealing on the magnetic properties of thin films of Co Pd alloys," Technical Physics, US, American Institute of Physics, vol. 43, No. 4, pp. 407-411, Apr. 1998.
Yoon et al., "Time-dependent magnetization reversal in amorphous CoSiB/Pd multilayers with perpendicular magnetic anisotropy," Journal of Applied Physics, US, AIP Publishing, vol. 113, No. 17, pp. 17A342-1-17A342-3, Apr. 12, 2013.
Office Action for Korean Application No. 10-2016-0170108 dated Feb. 27, 2017.
Office Action for Korean Application No. 10-2016-0170114 dated Feb. 27, 2017.
Notice of Allowance for Korean Application No. 10-2016-0170108 dated May 10, 2017.
Notice of Allowance for Korean Application No. 10-2016-0170114 dated May 10, 2017.
Office Action for Japanese Application No. JP 2017-099031 dated Jan. 23, 2018.
Office Action for Japanese Application No. JP 2017-098812 dated Jun. 5, 2018.
Notice of Allowance for Japanese Application No. JP 2017-099031 dated Jun. 26, 2018.
Notice of Allowance for Japanese Application No. JP 2017-098812 dated Oct. 23, 2018.
Sol Jung et al., Amorphous Ferromagnetic CoSiB/Pd Multilayer with Perpendicular Magnetic Anisotropy, Journal of the Korean Physical Society,Jan. 2013, vol. 62, No. 1, pp. LIO-L13.
Sol Jung et al., Perpendicular Magnetic Anisotropy in CoSiB/Pd Multi layers with Various Thicknesses, Journal of the Korean Physical Society, Jan. 2013, vol. 62, No. 2, pp. L201-L205.
Sol Jung et al., "Dependence of Perpendicular Magnetic Anisotropy and Hall Resistivity on Pd-layer Thickness in CoSiB/Pd Multilayer", Journal of the Korean Physical Society, Aug. 2015, vol. 67, No. 3, pp. 547-550.
Non-Final Office Action for U.S. Appl. No. 15/599,259 dated Nov. 15, 2019.
Final Office Action for U.S. Appl. No. 15/599,259 dated May 27, 2020.
Notice of Allowance for U.S. Appl. No. 15/599,259 dated Aug. 5, 2020.

\* cited by examiner (a)

(b)

ALLOY THIN FILMS EXHIBITING PERPENDICULAR MAGNETIC ANISOTROPY

CROSS-REFERENCE TO RELATED APPLICATIONS

This U.S. non-provisional application claims priority under 35 U.S.C. § 119 to Korea Patent Application No. 10-2016-0170108 filed on Dec. 14, 2016, the entirety of which is incorporated by reference herein.

TECHNICAL FIELD

The present disclosure relates to magnetic alloy thin films and, more particularly, to an alloy thin film which exhibits perpendicular magnetic anisotropy and maintains the perpendicular magnetic anisotropy even after high-temperature annealing of about 500 degrees Celsius and a magnetic memory device using the alloy thin film.

BACKGROUND

Among the next-generation memories for replacing conventional memories, a magnetic random access memory (MRAM) is a nonvolatile memory and is increasingly becoming attractive due to its advantages such as high driving speed, low driving voltage, and high information retention durability.

Since magnetic memories can realize both high bit density of a dynamic random access memory (DRAM) and high speed of a static random access memory (SRAM), they are being magnified as alternative means of conventional memories used in a smartphone, a computer, and a network. Moreover, there are attempts to apply magnetic memories to electronic products for Internet of Things (IoT) which requires low power and non-volatility and there is a strong probability that magnetic memories will be used in automobiles, robots, and the like.

A magnetic tunnel junction (MTJ) is a core element of an MRAM and should achieve perpendicular magnetic anisotropy (PMA) to implement high tunneling magnetoresistance ratio (TMR), high writing stability, low current density, and high bit density.

A magnetic tunnel junction (MTJ) has a three-layered structure in which ferromagnetic substance/oxide/ferromagnetic substance are stacked. The ferromagnetic material/oxide/ferromagnetic material structure includes a pinned layer (PL), a tunnel barrier (TB), and a free layer (FL), respectively. Positions of the free layer and the pinned layer are interchangeable. The magnitude of tunneling current passing through a tunnel barrier varies depending on a state in which a spin direction of a free layer and a pinned layer arranged adjacent to each other with the tunnel barrier interposed therebetween is parallel or antiparallel. At this point, a resistance difference is called a tunnel magnetoresistance ratio (TMR). A spin direction of the pinned layer fixed and may be handled by applying a magnetic field or current to input information.

The magnetic tunnel junction (MTJ) has a sandwich shape of two ferromagnetic layers with an insulating layer (generally, MgO) interposed therebetween as a tunnel barrier and exhibits a phenomenon in which current flows vertically to each layer. The two ferromagnetic layers include a pinned layer acting as a reference layer and a free layer having a storing or sensing function. If magnetization directions of the two ferromagnetic layers are identical to each other (parallel) when current flows, a resistance is low and tunneling probability of the current is high. Meanwhile, if the magnetization directions of the two ferromagnetic layers are opposite to each other (antiparallel) when the current flows, the resistance is high and the tunneling probability of the current is low. A memory cell of sub-micrometer unit needs to be formed to achieve very high bit density of a magnetic memory. When an aspect ratio of the cell is reduced while a size of the magnetic tunnel junction is reduced to achieve high bit density of the magnetic layer, a multi-domain or a vortex is formed in a magnetic body of the magnetic tunnel junction by a multi-domain or a vortex to cause an unstable cell switching phenomenon. Thus, a write margin is reduced.

If a cell is formed with a high aspect ratio, such a multi-domain structure is not formed by shape magnetic anisotropy but cannot achieve high bit density and requires a large switching magnetic field. As a result, high bit density cannot be achieved.

For the above reasons, a magnetic field having perpendicular magnetic anisotropy (PMA) was developed (Naoki Nishimura et al., J. Appl. Phys., vol. 91, p. 5246. 2002). Nishimura's group controlled a magnetic tunnel junction to obtain a magnetoresistance ratio of 55 percent by using TbFeCo and GdFeCo, which are well-known materials exhibiting perpendicular magnetic anisotropy, as a free layer and a pinned layer, respectively. In addition, through a magnetic force microscope (MFM), the Nishimura's group confirmed that magnetization distortion does not occur in an MTJ with perpendicular magnetic anisotropy (PMA). However, Tb, Gd, and the like used in this test cannot be commercialized because they are rare-earth metals that are not abundant on the earth. Thus, new perpendicular anisotropy materials need to be developed to commercialize the MTJ with perpendicular magnetic anisotropy (PMA).

Traditionally studied PMA thin films have been developed to replace an in plane magnetic recording medium that will encounter a limitation in high density. Materials exhibiting perpendicular magnetic anisotropy are CoCr-based alloy film, Co/Pt, Co/Pd multilayer thin film, and the like. Physical properties required for these materials include high perpendicular magnetic anisotropy, high coercivity, and high remanent magnetization values to achieve both stability and reliability of a recording magnetic domain.

However, a magnetic memory requires fast switching and a low-power operation. Thus, high magnetic anisotropy is required to improve low coercivity and reading margin. A remanent magnetization value and a saturation magnetization value are similar to each other and need to remain small to reduce power consumption.

A magnetic tunnel junction having perpendicular magnetic anisotropy is briefly referred to as a perpendicular magnetic tunnel junction (pMTJ). A thin film with PMA having low coercivity and high magnetic anisotropy values is required to be used as a free layer of a pMTJ. Additionally, a thin film with PMA is required to be used as a pinned layer of the pMTJ to obtain high coercivity and high thermal stability.

In general, a magnetic tunnel junction is formed by deposition such as sputtering or molecular beam epitaxy (MBE). However, materials exhibiting perpendicular magnetic anisotropy are limited and are significantly affected by a fine structure and an interface change of a deposited film. In particular, an important technical issue is to maintain perpendicular magnetic anisotropic characteristics at a high temperature (conventionally, 400 degrees Celsius or higher) required for a back-end-of-line (BEOL) among semiconductor processes.

A multilayer thin film can easily provide a structural modification while maintaining PMA which results in an advantage to control magnetic properties. However, a fatal disadvantage of a conventional multilayer thin film is that the PMA is weakened after annealing of about 250 degrees Celsius. Currently, there is a need for a novel magnetic material for a free layer or a pinned layer which maintains strong perpendicular magnetic anisotropy even after high-temperature annealing of about 400 degrees Celsius.

SUMMARY

A feature of the present disclosure is to provide a magnetic layer required for a magnetic tunnel junction which maintains perpendicular magnetic anisotropy even after high-temperature annealing.

Another feature of the present disclosure is to reduce the process steps by using co-deposition that is a simpler method to deposit an alloy thin film instead of a conventional multilayer magnetic thin film.

The features of the present disclosure are not limited to the foregoing, but other features not described herein will be clearly understood by those skilled in the art from the following descriptions.

A method to form a CoFeSiB—Pd alloy thin film exhibiting perpendicular magnetic anisotropy according to an example embodiment of the present disclosure includes: simultaneous sputter-deposition of a CoFeSiB target and a Pd target inside a vacuum chamber to form a CoFeSiB—Pd alloy thin film on a substrate disposed inside the vacuum chamber; and annealing the substrate, on which the CoFeSiB—Pd alloy thin film is formed, to exhibit perpendicular magnetic anisotropy.

In an example embodiment, the method may further include: forming a buffer layer before forming the CoFeSiB—Pd alloy thin film.

In an example embodiment, the method may further include: forming a seed layer before forming the buffer layer; and forming a capping layer after forming the CoFeSiB—Pd alloy thin film.

In an example embodiment, a temperature of annealing the substrate, on which the CoFeSiB—Pd alloy thin film is formed, may be higher than 300 degrees Celsius and lower than 600 degrees Celsius.

In an example embodiment, the CoFeSiB—Pd alloy thin film may be formed by direct current (dc) sputtering using the CoFeSiB target and the Pd target.

In an example embodiment, a composition ratio of the CoFeSiB target may be $Co_xFe_ySi_{15}B_{10}$ (atomic percent) where x=70.5~75 and y=4.5~0.

In an example embodiment, the CoFeSiB—Pd alloy thin film may be deposited under an atmosphere of argon and an atmosphere of 1 mTorr to 10 mTorr.

In an example embodiment, a volume ratio of CoFeSiB to Pd may be 1:1.6 to 1:7.

In an example embodiment, a squareness of the CoFeSiB—Pd alloy thin film exhibiting the perpendicular magnetic anisotropy may be 90 percent or more, saturation magnetization of the CoFeSiB—Pd alloy thin film may be 200 emu/cm$^3$ or more, and magnetic anisotropy energy may be $1.53\times10^6$ erg/cm$^3$ or more.

A method for forming a CoSiB—Pd alloy thin film exhibiting perpendicular magnetic anisotropy according to an example embodiment of the present disclosure includes: simultaneous sputter-deposition of a CoSiB target and a Pd target inside a vacuum chamber to form a CoSiB—Pd alloy thin film on a substrate disposed inside the vacuum chamber; and annealing the substrate, on which the CoSiB alloy thin film is formed, to exhibit perpendicular magnetic anisotropy.

In an example embodiment, the method may further include: forming a buffer layer before forming the CoSiB—Pd alloy thin film.

In an example embodiment, the method may further include: forming a seed layer before forming the buffer layer; and forming a capping layer after forming the CoSiB—Pd alloy thin film.

In an example embodiment, a temperature of annealing the CoSiB—Pd alloy thin film may be higher than 300 degrees Celsius and lower than 600 degrees Celsius.

In an example embodiment, the CoSiB—Pd alloy thin film may be formed by DC sputtering using the CoFeSiB target and the Pd target.

In an example embodiment, a composition ratio of the CoSiB target may be $Co_{75}Si_{15}B_{10}$ (atomic percent).

In an example embodiment, the CoSiB—Pd alloy thin film may be deposited under an atmosphere of argon and an atmosphere of 1 mTorr to 10 mTorr.

In an example embodiment, a volume ratio of CoSiB to Pd may be 1:1.6 to 1:7.

A CoFeSiB—Pd alloy thin film exhibiting perpendicular magnetic anisotropy according to an example embodiment of the present disclosure is formed on a substrate. The CoFeSiB—Pd alloy thin film may be co-deposited in an amorphous state and may be annealed to exhibit perpendicular magnetic anisotropy and to change into a polycrystalline structure.

In an example embodiment, a squareness of the CoFeSiB—Pd alloy thin film exhibiting the perpendicular magnetic anisotropy may be 90 percent or more, saturation magnetization of the CoFeSiB—Pd alloy thin film may be 200 emu/cm$^3$ or more, and magnetic anisotropy energy may be $1.53\times10^6$ erg/cm$^3$ or more.

In an example embodiment, a thickness of the CoFeSiB—Pd alloy thin film may be between 9.5 nm and 20 nm, and a volume ratio of CoFeSiB to Pd may be 1:1.6 to 1:7.

In an example embodiment, the CoFeSiB—Pd alloy thin film may further include: a buffer layer below the CoFeSiB—Pd alloy thin film. The buffer layer may be Pd having a thickness of 3 nm or more.

A CoSiB—Pd alloy thin film exhibiting perpendicular magnetic anisotropy according to an example embodiment of the present disclosure may be formed on a substrate. The CoSiB—Pd alloy thin film may be co-deposited in an amorphous state and may be annealed to exhibit perpendicular magnetic anisotropy and to change into a polycrystalline structure.

In an example embodiment, a squareness of the CoFeSiB—Pd alloy thin film exhibiting the perpendicular magnetic anisotropy may be 90 percent or more, and saturation magnetization of the CoFeSiB—Pd alloy thin film may be 200 emu/cm$^3$ or more.

In an example embodiment, a thickness of the CoSiB—Pd alloy thin film may be between 9.5 nm and 20 nm, and a volume ratio of CoSiB to Pd may be 1:1.6 to 1:7.

In an example embodiment, the CoSiB—Pd alloy thin film may further include: a buffer layer below the CoSiB—Pd alloy thin film. The buffer layer may be Pd having a thickness of 3 nm or more.

A magnetic tunnel junction device according to an example embodiment of the present disclosure includes: a tunnel insulating layer interposed between a free layer whose magnetization direction is switched and a pinned layer whose magnetization direction is fixed. The pinned layer may include: a seed layer; a buffer layer disposed on the seed layer; and a first pinned layer disposed on the buffer layer. The first pinned layer may include a CoFeSiB—Pd alloy thin film or a CoSiB—Pd alloy thin film. The CoFeSiB—Pd alloy thin film or the CoSiB—Pd alloy thin film of the first pinned layer may exhibit perpendicular magnetic anisotropy by annealing.

In an example embodiment, the pinned layer may further include: a non-magnetic metal layer disposed on the first pinned layer and a second pinned layer disposed on the non-magnetic metal layer. The second pinned layer may include a CoFeB thin film exhibiting perpendicular magnetic anisotropy.

BRIEF DESCRIPTION OF THE DRAWINGS

The present disclosure will become more apparent in view of the attached example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
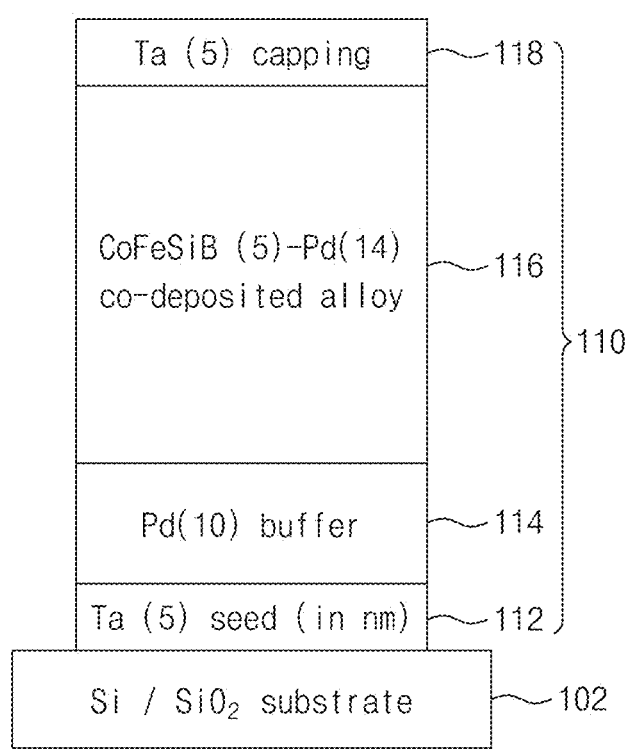
FIG. 1 illustrates a perpendicular magnetic anisotropy alloy thin film according to an example embodiment of the present disclosure.

A magnetic tunnel junction (MTJ) makes a low-current-density operation having high bit stability possible. Thus, magnetic tunnel junctions (MTJs) having perpendicular magnetic anisotropy (PMA) may be used in a nonvolatile magnetic random access memory.

Conventionally, an MTJ device with PMA (pMTJ) requires TMR of 100 percent or higher, writing stability of 60 or more, and low critical current required for magnetization reversal.

Moreover, a magnetic tunnel junction should endure a back-end-of-line (BEOL) integrated circuit process including a high temperature of about 450 degrees Celsius. Accordingly, when the magnetic tunnel junction is exposed to a high temperature, degradation in perpendicular magnetic anisotropy is problematic. As a result, it is important to search a material which can endure high-temperature annealing while maintaining desired magnetic properties such as perpendicular magnetic anisotropy.

Conventionally, a multilayer thin film structure exhibits perpendicular magnetic anisotropy before annealing. However, to secure a back-end-of-line (BEOL) thermal resistance, a key point of the multilayer thin film structure is to continuously maintain perpendicular magnetic anisotropy even after post-deposition annealing.

Several ferromagnetic systems including rare-earth transition-metal alloys such as TbFeCo and GdFeCo exhibit perpendicular magnetic anisotropy properties.

However, a magnetic tunnel junction including these alloys loses the perpendicular magnetic anisotropy after post-deposition annealing of 200 degrees Celsius or higher.

Another system includes $L1_0$ ordered alloys such as FePd and FePt. The ordered alloys provide large uniaxial anisotropy constant ($K_u$) values in the range of $10^7$ erg/cm$^3$. However, since the ordered alloys require a high-temperature treatment of 500 degrees centigrade or higher during deposition of a thin film, it is difficult to achieve chemical ordering.

Another system having perpendicular magnetic anisotropy is a well-known cobalt-based multiplayer thin film such as Co/Pd, Co/Pt, CoFe/Pd or CoFe/Pt. Important magnetic properties such as saturation magnetization ($M_s$) and uniaxial anisotropy constant ($K_u$) may be adjusted by changing thicknesses of a ferromagnetic layer and a non-magnetic layer and the number of bilayers.

A thickness of a pinned layer constituting a cobalt-based multilayer thin film ranges from 5 nm to 20 nm. The number (n) of repeated bilayers may vary from 5 to 10. A cause of perpendicular magnetic anisotropy with respect to a Co/Pd multilayer thin film is known as an interfacial effect resulting from lowered symmetry at the interface or stressed interfacial alloying between a ferromagnetic layer and a non-magnetic layer.

Additionally, it is known that the perpendicular magnetic anisotropy is degraded at a cobalt-based multilayer thin film during annealing of 300 degrees Celsius or higher due to Co—Pd interdiffusion or Pd diffusion at Co/Pd interface. It is known that perpendicular magnetic anisotropy materials used in a conventional MTJ are significantly affected by a fine structure and interface change of a deposited layer.

In the present disclosure, we investigated perpendicular magnetic anisotropy characteristics at a CoFeSiB—Pd alloy thin film (or a CoSiB—Pd alloy thin film). The CoFeSiB—Pd alloy thin film (or the CoSiB—Pd alloy thin film) were prepared by co-deposition and exhibited magnetic anisotropy even when being annealed at a temperature of about 500 degrees Celsius. The CoFeSiB—Pd alloy thin film (or the CoSiB—Pd alloy thin film) prepared by the co-deposition may reduce time required to form a multilayer thin film to enhance productivity.

An example embodiment of the present disclosure proposes a novel magnetic thin film which does not exhibits perpendicular magnetic anisotropy in the as-deposited state but exhibits the perpendicular magnetic anisotropy through an annealing process after the deposition. The magnetic thin film controls precise thin film thickness and composition ratio to form a multilayer thin film and has a noticeable economic effect as compared to a conventional multilayer thin film structure. Annealing may be independently performed on a substrate, on which the CoFeSiB—Pd alloy thin film (or the CoSiB—Pd alloy thin film) is formed, to exhibit perpendicular magnetic anisotropy or may be replaced with annealing performed after forming another thin film required for a magnetic tunnel junction. Thus, the process steps may be reduced. The alloy thin film exhibited by the annealing may be used as a pinned layer or a free layer of a magnetic tunnel junction.

An alloy thin film according to an example embodiment of the present disclosure may be applied to a magnetic tunnel junction having a CoFeB(free layer)/MgO(tunnel barrier)/CoFeB (pinned layer) structure which causes a high tunnel magnetic resistance (TMR). More specifically, the alloy thin film may be applied to Pd/[CoFeSiB—Pd]/W (or Ta)/CoFeB/MgO(tunnel barrier)/CoFeB. Thus, high annealing stability of the level of 400 degrees Celsius may be secured while having a high TMR value.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

FIG. 1 illustrates a perpendicular magnetic anisotropy alloy thin film according to an example embodiment of the present disclosure.

Referring to FIG. 1, a method for forming a perpendicular magnetic anisotropy alloy thin film 110 includes simultaneously sputtering a CoFeSiB target and a Pd target inside a vacuum chamber to form a CoFeSiB—Pd alloy thin film 116 on a silicon substrate 102 disposed inside the vacuum chamber and annealing the substrate 102, on which the CoFeSiB—Pd alloy thin film 102 is formed, to exhibit perpendicular magnetic anisotropy.

A seed layer 112, a buffer layer 114, a CoFeSiB—Pd alloy thin film 116, and a capping layer 118 may be sequentially stacked on the substrate 102. The seed layer 112 may be Ta of 5 nm, the buffer layer 114 may be Pd of 10 nm, and the CoFeSiB—Pd alloy thin film 116 may be a CoFeSiB—Pd alloy of 19 nm. The capping layer 118 may be Ta of 5 nm.

A perpendicular magnetic anisotropy thin film sample according to an example embodiment of the present disclosure was prepared, as follows. The perpendicular magnetic anisotropy thin film 110 is a silicon substrate/silicon oxide/Ta 5/Pd 10/[CoFeSiB 5-Pd 14]/Ta 5 (thickness unit: nm). The silicon substrate is single crystalline, the silicon oxide is silicon oxide formed on a substrate to a thickness of 300 nm, the Ta is a seed layer, and the Pd is a buffer layer. Another Ta layer is a capping layer. The CoFeSiB—Pd alloy thin film 116 is an alloy thin film formed by co-deposition. The CoFeSiB—Pd alloy thin film 116 is formed by co-depositing CoFeSiB corresponding to a thickness of 5 nm and Pd corresponding to a thickness of 14 nm. Thus, the total thickness of the CoFeSiB—Pd alloy thin film 116 is 19 nm.

According to an example embodiment of the present disclosure, a [CoFeSiB 5-Pd 14] alloy thin film is formed by dc magnetron sputtering. A magnetron sputtering system has a base pressure of $5\times10^{-9}$ Torr or less. A thickness of the thin film may be adjusted through deposition time and sputtering power. The magnetron sputtering system includes a CoFeSiB target and a Pd target. The [CoFeSiB 5-Pd 14] alloy thin film is simultaneously formed by adjusting sputtering power applied to the CoFeSiB target and sputtering power applied to the Pd target. A composition ratio of the CoFeSiB target is $Co_{70.5}Fe_{4.5}Si_{15}B_{10}$ (each number being atomic percent). The [CoFeSiB5-Pd14] alloy thin film in the as-deposited state does not exhibit perpendicular magnetic anisotropy at room temperature.

For example, to deposit a thin film, a dc power density may be 2.5 W/cm$^2$ and a pure argon pressure may be maintained at about 2 mTorr. Deposition rates of CoFeSiB and Pd may be 0.0298 nm/s and 0.127 nm/s, respectively. The deposition rates may be controlled by adjusting power applied to a target. A structure of the thin film is Si/SiO$_2$/Ta (seed layer) 5/Pd (buffer layer) 10/[CoFeSiB 5-Pd 14]/Ta (capping layer) 5 (unit:nm). The seed layer is Ta and functions as an adhesion layer. The capping layer is Ta and functions as a protection layer. The deposited CoFeSiB—Pd alloy thin film 116 is changed to a polycrystalline state by subsequent annealing to exhibit perpendicular magnetic anisotropy.

[Post-Deposition Annealing Stability of Thin Film]

After formation of the CoFeSiB—Pd alloy thin film 116, the silicon substrate 102 was annealed in an annealing furnace. Samples were annealed at temperatures of 300 degrees Celsius, 400 degrees Celsius, and 500 degrees Celsius for an hour after deposition of the thin film, respectively. The annealing was performed for an hour under $10^{-6}$ Torr vacuum with an applied external magnetic field of 6 kOe. After the subsequent annealing, the [CoFeSiB 5-Pd 14] alloy thin film 116 exhibited perpendicular magnetic anisotropy.

Figure 2:
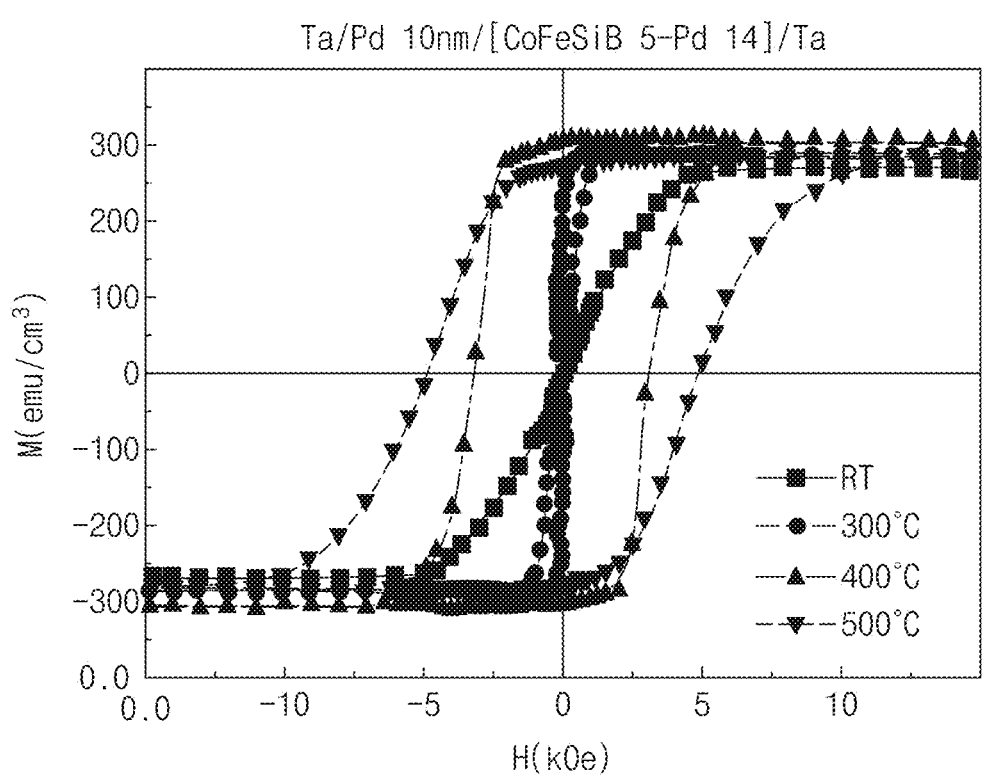
FIG. 2 shows a magnetic hysteresis curve depending on an annealing temperature measured by a vibrating sample magnetometer (VSM).

FIG. 2 shows a magnetic hysteresis curve depending on an annealing temperature measured by a vibrating sample magnetometer (VSM).

Referring to FIG. 2, a first sample has a structure of Ta/Pd 10 nm/[CoFeSiB 5 nm-Pd 14 nm]/Ta. The first sample was formed by of co-deposition according to an example embodiment of the present disclosure, and a CoFeSiB—Pd alloy thin film of the first sample did not exhibit perpendicular magnetic anisotropy at room temperature before annealing. However, the first sample strongly exhibits perpendicular magnetic anisotropy after annealing of 400 degrees Celsius and annealing of 500 degrees Celsius are performed.

The first sample exhibits low coercivity when deposition is performed, exhibits coercivity of about 3 kiloOersteds (kOe) when annealing of 300 degrees Celsius is performed for an hour, and exhibits coercivity of about 5 kOe when annealing of 500 degrees Celsius is performed for an hour.

FIG. 3(a)-(d) illustrate magnetic characteristics depending on an annealing temperature of an alloy thin film according to an example embodiment of the present disclosure.

Figure 3:
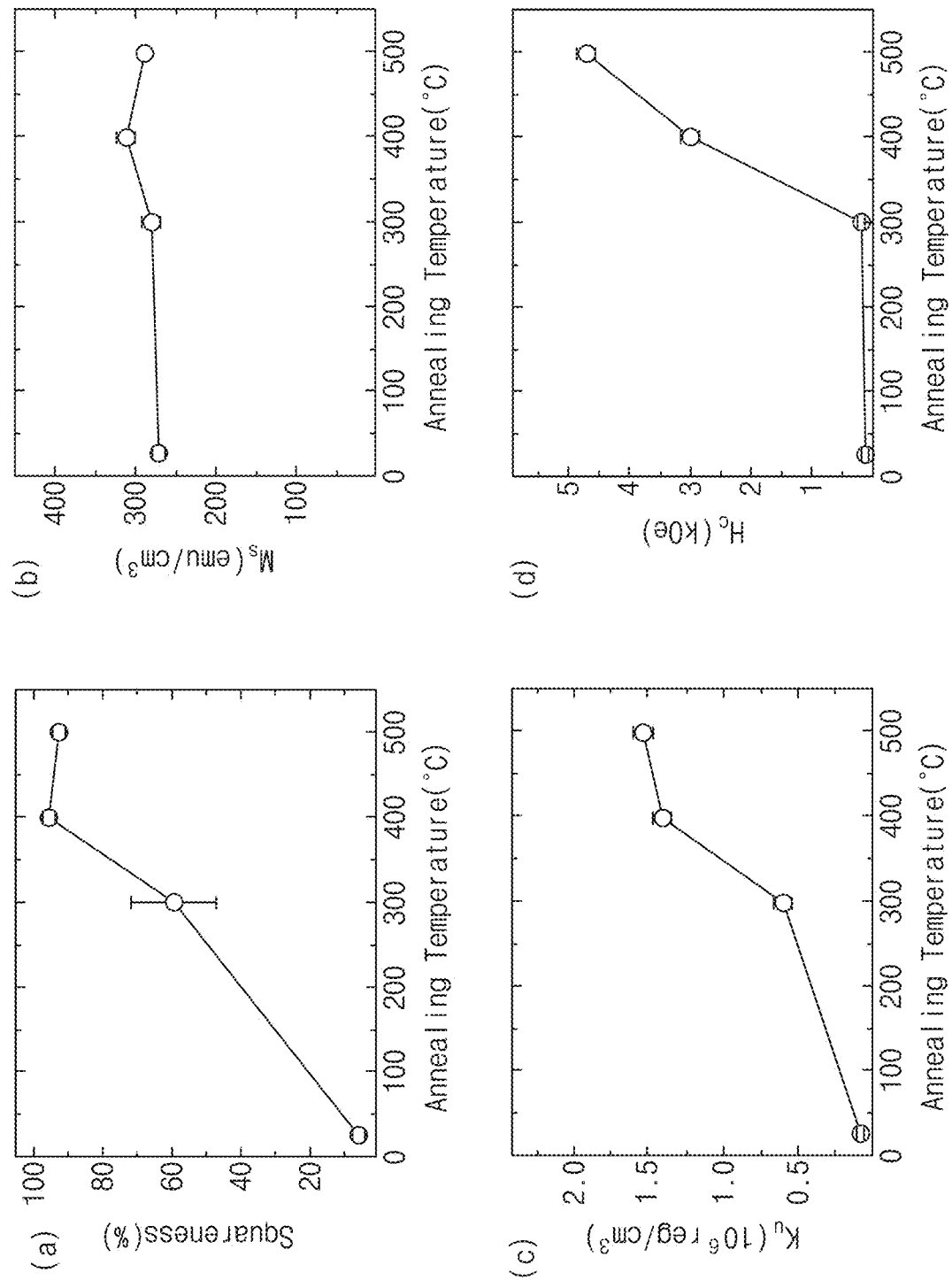
FIG. 3(a)-(d) illustrate magnetic characteristics depending on an annealing temperature of an alloy thin film according to an example embodiment of the present disclosure.

Referring to FIG. 3(a), a squareness exceeded 90 percent when annealing of 400 degrees Celsius or more was performed. The squareness of 90 percent or more was maintained even after annealing of 500 degrees Celsius. The squareness ($M_r/M_s$) is defined as a ratio of remanent magnetization ($M_r$) to saturation magnetization ($M_s$).

Referring to FIG. 3(b), a saturation magnetization ($M_s$) value of about 300 emu/cm³ was maintained irrespective of an annealing temperature.

Referring to FIG. 3(c), effective uniaxial magnetic anisotropy energy ($K_{u,eff}$) increased as an annealing temperature increased and exhibited 1.53×10⁶ erg/cm³ after annealing of 500 degrees Celsius. The saturation magnetization was calculated using the volume of the alloy thin film 116 except for the seed layer 112, the Pb buffer layer 114, and the capping layer 118.

Referring to FIG. 3(d), coercivity $H_c$ rapidly increased during annealing of 400 degrees Celsius and exhibited 4700 Oe after annealing of 500 degrees Celsius. Based on the magnetic characteristics, the CoFeSiB—Pd alloy thin film 116 may be used as a pinned layer of a magnetic tunnel junction. When annealing is performed at a temperature ranging from 300 to 600 degrees Celsius for an hour or more, the CoFeSiB—Pd alloy thin film 116 exhibits perpendicular magnetic anisotropy. The CoFeSiB—Pd alloy thin film 116 exhibits high coercivity of 3 kOe or higher, constant saturation magnetization of about 300 emu/cm³, and high magnetic anisotropy energy of the level of about 1.53×10⁶ erg/cm³. Variation in the coercivity is predicted to result from change of a fine structure of the thin film when annealing is performed. The CoFeSiB—Pd alloy thin film 116 may be used as a pinned layer of a magnetic tunnel junction.

Figure 4:
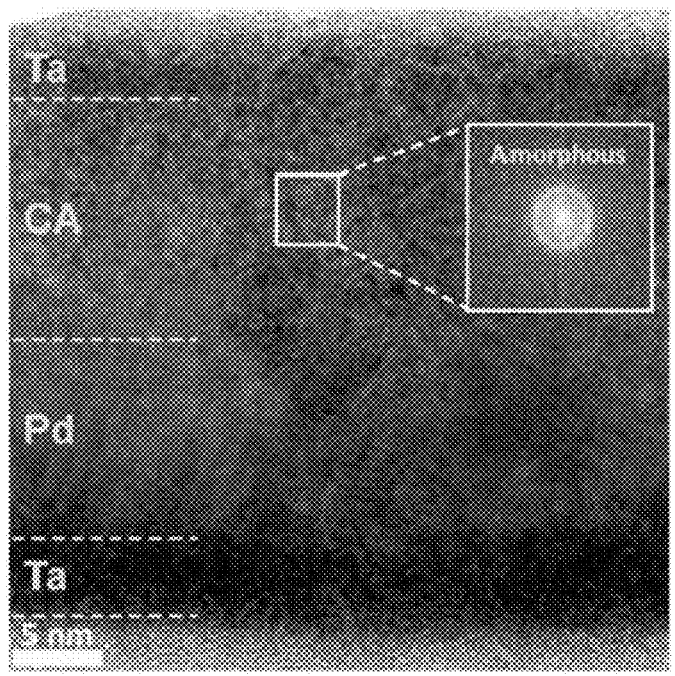
FIG. 4(a)-(b) are cross-sectional images of a thin film sample obtained using a transmission electron microscope (TEM).
Figure 4:
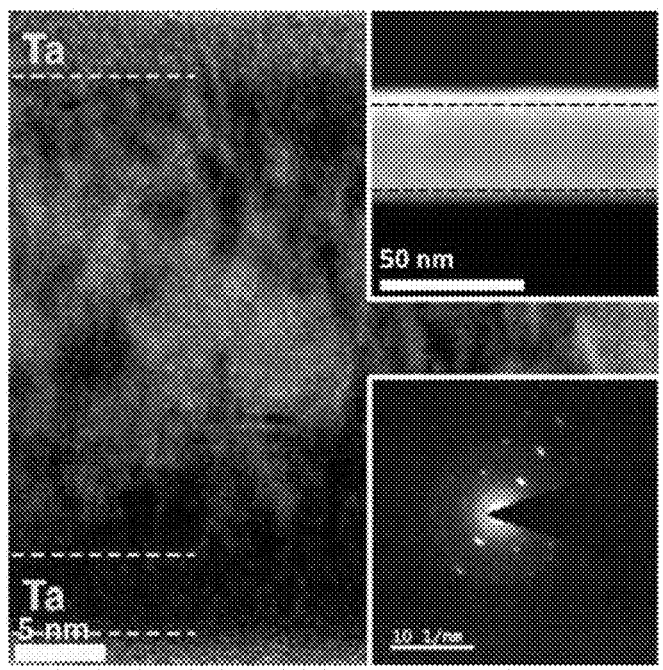

FIG. 4(a)-(b) are cross-sectional images of a thin film sample obtained using a transmission electron microscope (TEM).

FIG. 4(a) is a cross sectional TEM image before annealing, and FIG. 4(b) is a TEM image after annealing of 500 degree Celsius. From FIGS. 4(a) and 4(b), it can be seen that the thin film sample changes from an amorphous structure to a polycrystalline structure after annealing. From a Fast Fourier Transformed (FFT) diffraction pattern having a blurred ring shape, it can be seen that the thin film sample is in an amorphous phase before the annealing. After the annealing of 500 degrees Celsius, interdiffusion occurs between an alloy thin film and a buffer layer.

Figure 5:
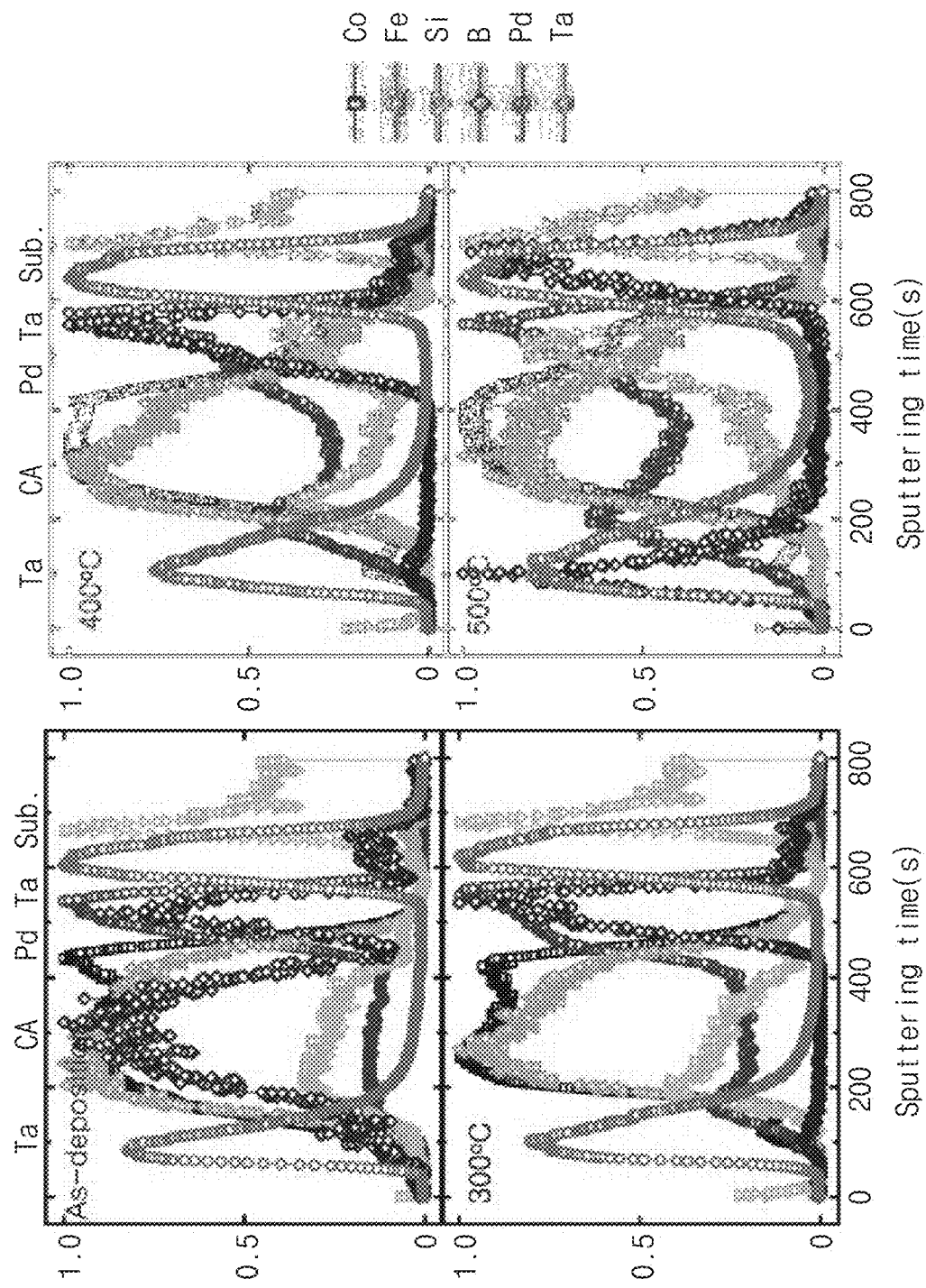
FIG. 5 illustrates an elemental depth profiling result depending on an annealing temperature measured using a secondary ion mass spectroscopy (SIMS).

FIG. 5 illustrates an elemental depth profiling result depending on an annealing temperature measured using a secondary ion mass spectroscopy (SIMS).

Referring to FIG. 5, an elemental depth profile was measured by secondary ion mass spectrometry using Cs⁺ ions.

It could be confirmed that a CoFeSiB—Pd alloy thin film and a buffer layer are clearly distinguished from each other before annealing. It also could be confirmed that Pd elements of the buffer layer are diffused to the CoFeSiB—Pd alloy thin film as the annealing is performed. Most boron (B) elements move to the buffer layer when annealing of 300 degrees Celsius is performed and move to the capping layer 118 and the seed layer 112 when annealing of 500 degree Celsius is performed.

Figure 6:
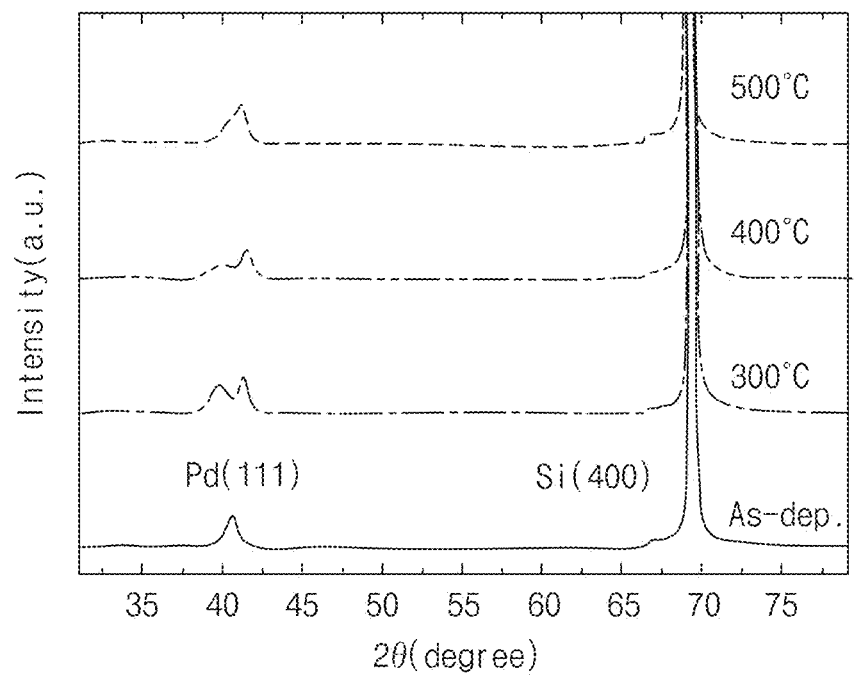
FIG. 6 illustrates X-ray diffraction (XRD) patterns according to an example embodiment of the present disclosure.
Figure 6:
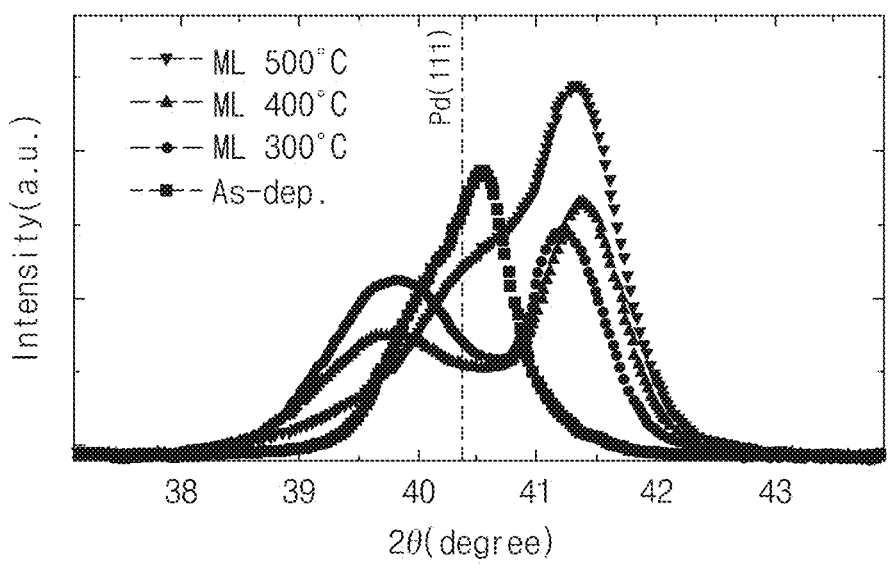

FIG. 6 illustrates X-ray diffraction patterns according to an example embodiment of the present disclosure.

Referring to FIG. 6, it can be confirmed that a CoPd-based alloy or an intermetallic compound is produced after annealing. It is known that boron (B) is diffused into the Pd layer 111, which is a buffer layer, to extend a Pd lattice. It is determined that although perpendicular magnetic anisotropy is not exhibited before annealing, a CoPd-based alloy or an intermetallic compound is produced after high-temperature annealing to maintain the perpendicular magnetic anisotropy. In a post-deposition annealing state, a peak of 40.51 degree Celsius results from a face-centered cubic (fcc) (111)-Pd. A Pd peak results from lattice deformation of a co-deposited CoFeSiB—Pd alloy thin film to have a slightly higher angle than fcc (111)-Pd (JCPDS No. 07-0645). After the annealing of 300 degrees Celsius, the Pd peak is divided into two Pd peaks. A peak position of the buffer layer moves at a low angle due to the B diffusion during the annealing. The estimated composition of interstitial B atoms in the Pd matrix considering the lattice parameter changes is between 5 and 6 atomic percent (at. %).

After the annealing of 500 degrees Celsius, an XRD peak position of the CoFeSiB—Pd alloy thin film is 41.3 degrees. The peak is very close to peaks of CoPd (41.0 degrees) and CoPd₃ (40.9 degrees) oriented in a (111) direction.

Compositions of Co and Pd that are two main components of the alloy thin film are 19 at. % and 81 at. %, respectively. Although the CoFeSiB—Pd alloy thin film is not a pure binary Co—Pd system, main components are Co and Pd and the amounts of the other components are small. Thus, an alloy formed after annealing can be regarded as a Pd-rich Co—Pd alloy. The main origin of the perpendicular magnetic anisotropy of CoFeSiB—Pd alloy thin film that underwent high-temperature annealing is thought to result from a bulk effect.

FIG. 7(a)-(b) show a magnetic hysteresis curve of an alloy thin film depending on a thickness of a Pd buffer layer.

Figure 7:
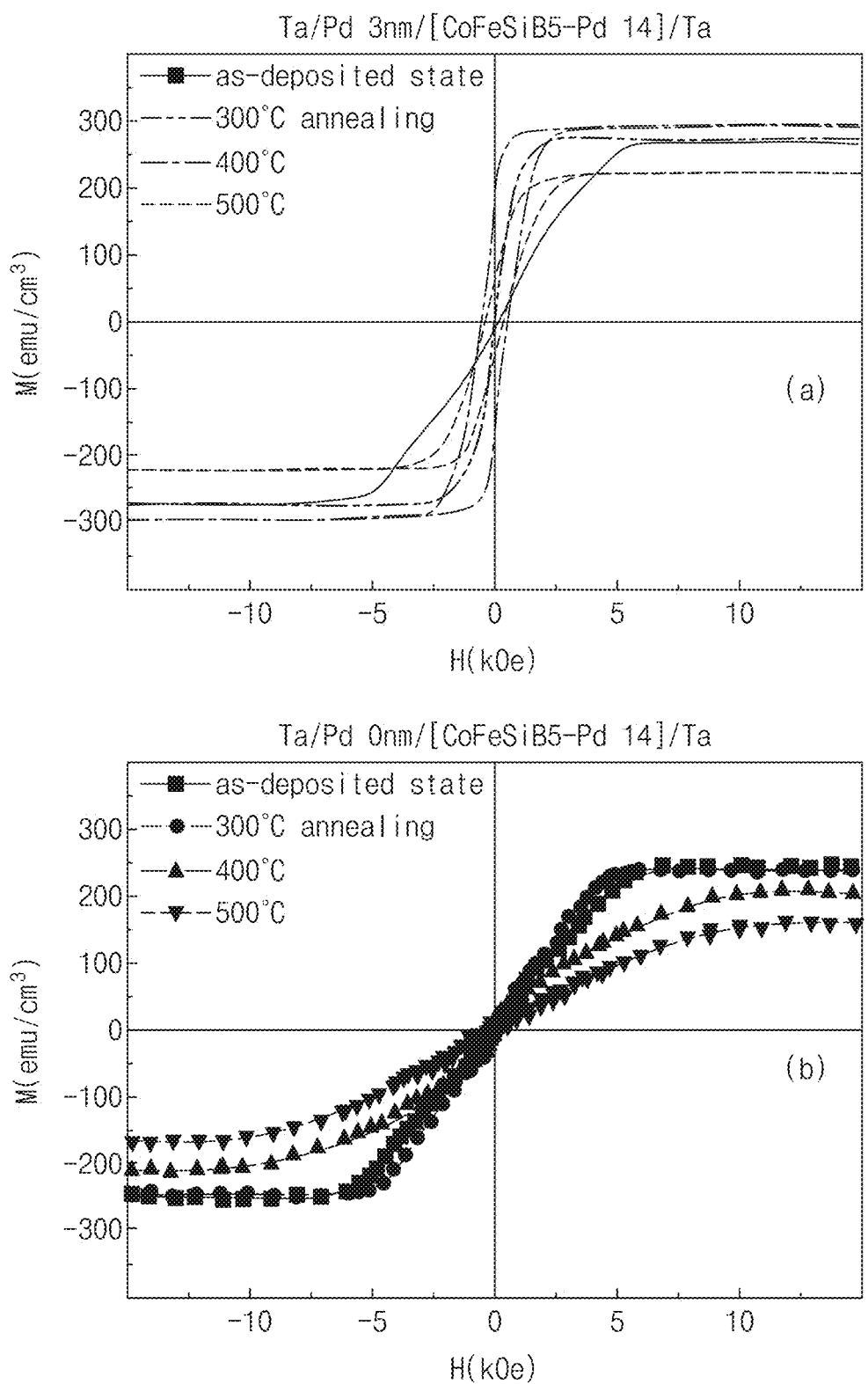
FIG. 7(a) shows a magnetic hysteresis curve of an alloy thin film depending on a thickness of a Pd buffer layer.
FIG. 7(b) shows a magnetic hysteresis curve of an alloy thin film depending on a thickness of a Pd buffer layer.

In FIG. 7, (a) indicates the case where a buffer layer is Pd having a thickness of 3 nm and (b) indicates the case where there is no buffer layer. Among perpendicular anisotropy characteristics, a noteworthy change was not observed even when the buffer layer 114 decreased from 10 nm to 5 nm. However, a magnetic characteristic was significantly changed when the buffer layer 114 decreased to 3 nm. A second sample has a Ta/Pd 3 nm/[CoFeSiB 5 nm-Pd 14 nm]/Ta structure, and a third sample has a Ta/Pd 0 nm/[CoFeSiB 5 nm-Pd 14 nm]/Ta structure.

The second sample did not exhibit sufficient coercivity after annealing, and the third sample completely lost the perpendicular magnetic anisotropy. Thus, a [CoFeSiB 5 nm-Pd 14 nm] alloy thin film needs to include a buffer layer of at least 3 nm to be used as a magnetic layer of a magnetic tunnel junction.

Figure 8:
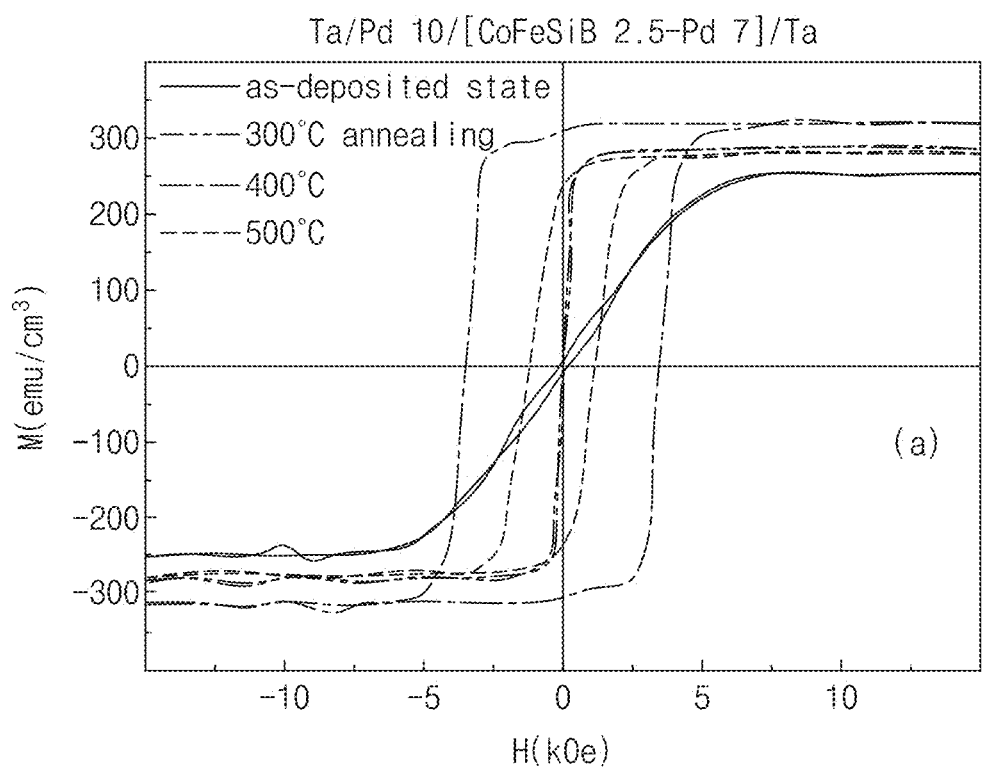
FIG. 8(a)-(b) show a magnetic hysteresis curve depending on a thickness of a CoFeSiB—Pd alloy thin film.
Figure 8:
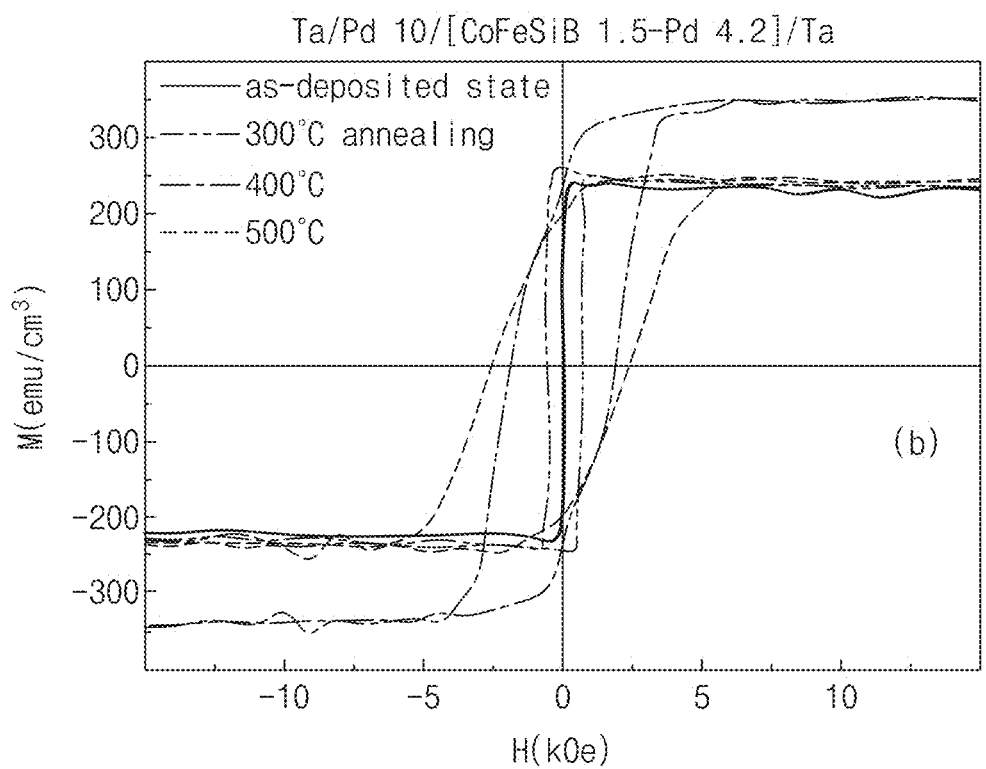

FIG. 8 shows a magnetic hysteresis curve depending on a thickness of a CoFeSiB—Pd alloy thin film.

Referring to FIG. 8, (a) is a magnetic hysteresis curve of a Ta/Pd 10/[CoFeSiB 2.5-Pd 7]/Ta structure and (b) is a magnetic hysteresis curve of a Ta/Pd 10/[CoFeSiB 1.5-Pd 4.2]/Ta structure. In the case of (a), a CoFeSiB—Pd alloy thin film is formed by co-depositing CoFeSiB corresponding to a thickness of 2.5 nm and Pd corresponding to a thickness of 7 nm to have the total thickness of 9.5 nm. In this case, the CoFeSiB—Pd alloy thin film exhibits perpendicular magnetic anisotropy after annealing of 400 degrees Celsius. However, since a saturation magnetization value varies depending on an annealing temperature, the CoFeSiB—Pd alloy thin film does not exhibit superior magnetic characteristics.

In the case of (b), a CoFeSiB—Pd alloy thin film is formed by co-depositing CoFeSiB corresponding to a thickness of 1.5 nm and Pd corresponding to a thickness of 4.2 nm to have the total thickness of 6.7 nm. However, since a saturation magnetization value varies depending on an annealing temperature, the CoFeSiB—Pd alloy thin film does not exhibit superior magnetic characteristics.

Accordingly, the thickness of the CoFeSiB—Pd alloy thin film 116 may preferably have a thickness ranging from 9.5 nm to 20 nm to exhibit stable magnetic characteristics. If the thickness of the CoFeSiB—Pd alloy thin film 116 is too small, the CoFeSiB—Pd alloy thin film 116 may lose magnetic characteristics. If the thickness of CoFeSiB—Pd alloy thin film 116 is too large, coercivity and saturation magnetization may increase excessively.

If a ratio of Pd increases to CoFeSiB, the saturation magnetization may decrease and the coercivity may decrease. A deposition rate of CoFeSiB and Pd may be 1:1.6 to 1:7. A thickness of the alloy thin film and a composition ratio of CoFeSiB and Pd may be selected to achieve appropriate coercivity, saturation magnetization, squareness or perpendicular magnetic anisotropy energy.

Figure 9A:
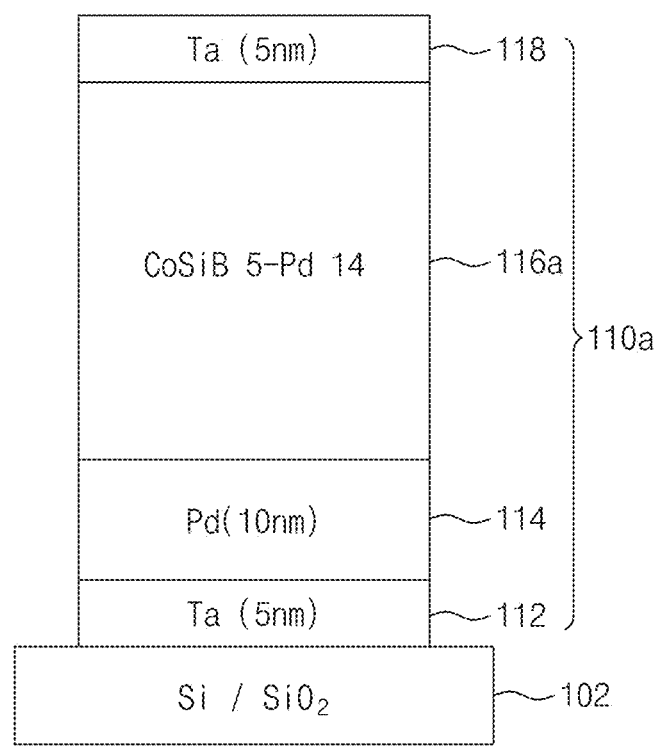
FIG. 9A is a conceptual diagram of a perpendicular magnetic anisotropy thin film according to another example embodiment of the present disclosure.

FIG. 9A is a conceptual diagram of a perpendicular magnetic anisotropy thin film according to another example embodiment of the present disclosure.

Figure 9B:
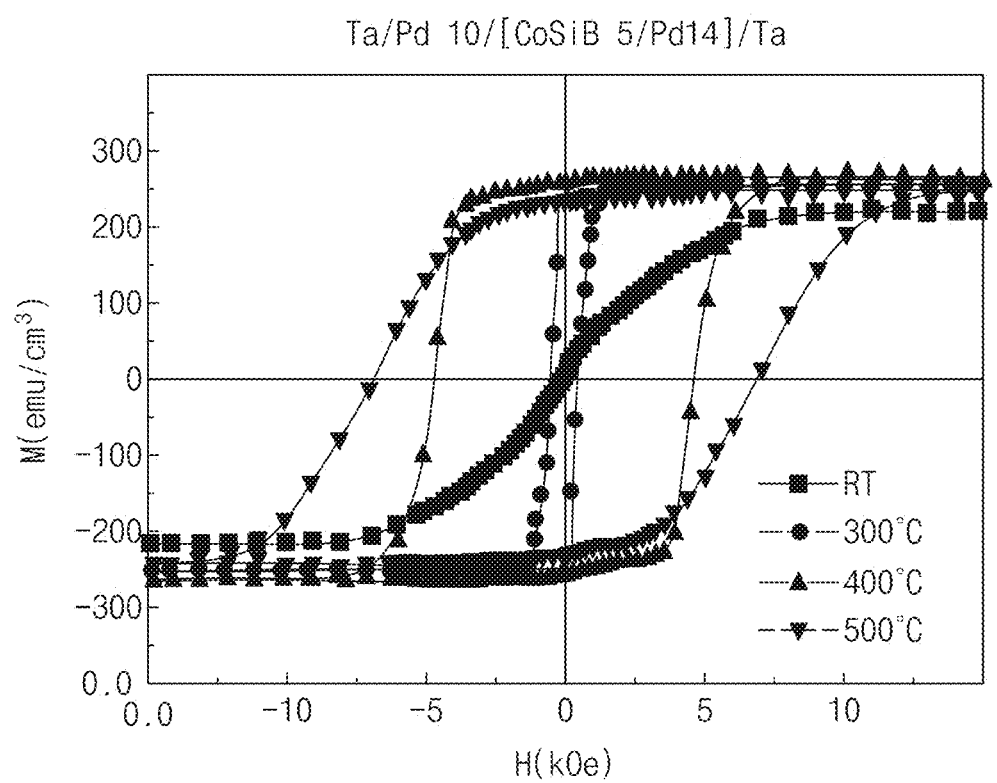
FIG. 9B shows a magnetic hysteresis curve of the perpendicular magnetic anisotropy thin film in FIG. 9A.

FIG. 9B shows a magnetic hysteresis curve of the perpendicular magnetic anisotropy thin film in FIG. 9A.

Referring to FIGS. 9A and 9B, a perpendicular anisotropy thin film 110a may include a seed layer 112, a buffer layer 114, a CoSiB—Pd alloy thin film 116a, and a capping layer 118 which are sequentially stacked on a substrate 102. The seed layer 112 may be Ta of 5 nm, the buffer layer 114 may be Pd of 10 nm, and the CoSiB—Pd alloy thin film 116a is a CoSiB—Pd alloy of 19 nm. The capping layer 118 may be Ta of 5 nm.

A method for forming a perpendicular magnetic anisotropy alloy thin film may include simultaneously sputtering a CoSiB target and a Pd target inside a vacuum chamber to form a CoSiB—Pd alloy thin film on a substrate 102 disposed inside the vacuum chamber and annealing a substrate 102, on which the CoSiB—Pd alloy thin film 116a is formed, to exhibit perpendicular magnetic anisotropy. The seed layer 112 may be formed before the buffer layer 114 is formed, and the capping layer 118 may be formed after the CoSiB—Pd alloy thin film 116a is formed. A temperature of annealing the substrate 102, on which the CoSiB—Pd alloy thin film 116a is formed, may be higher than 300 degrees Celsius and lower than 600 degrees Celsius. The CoSiB—Pd alloy thin film 114a may be formed by dc sputtering using the CoSiB target and the Pd target. A composition ratio of the CoSiB target may be $Co_{75}Si_{15}B_{10}$ (atomic percent). The CoSiB—Pd alloy thin film 116a may be deposited under an atmosphere of argon and an atmosphere of 1 mTorr to 10 mTorr. A volume ratio of CoSiB to Pd may be 1:1.6 to 1:7.

Figure 10:
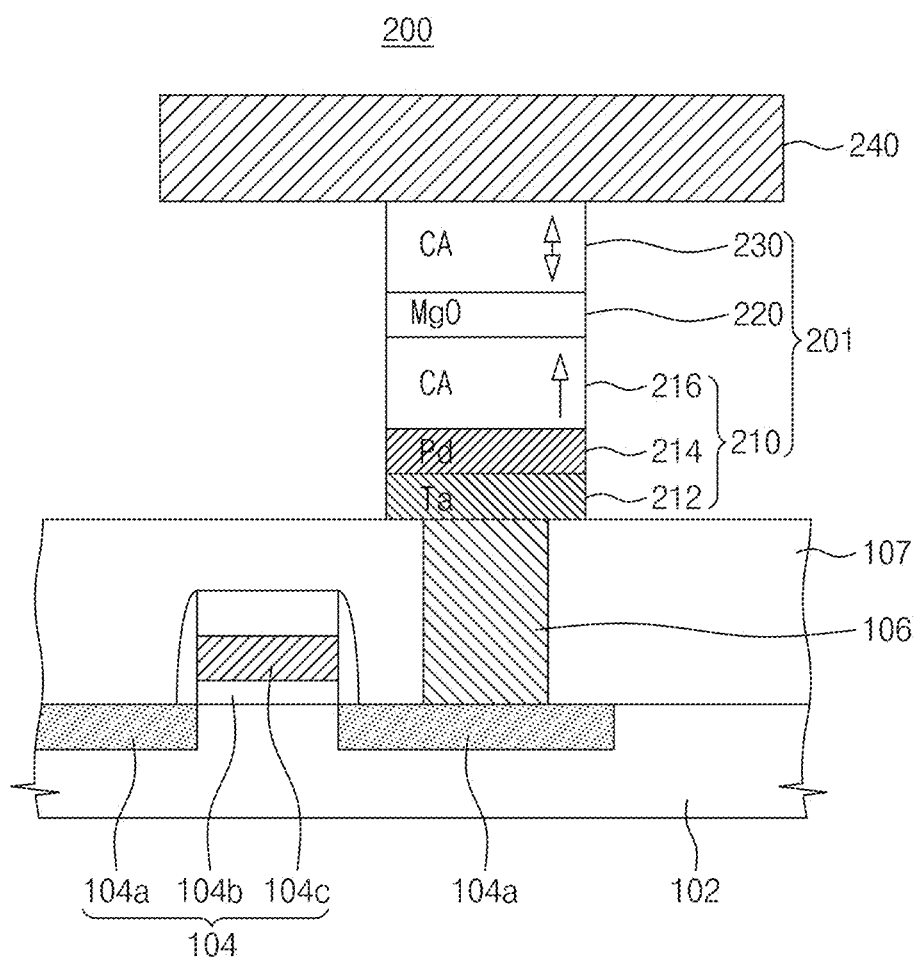
FIG. 10 is a conceptual diagram of a magnetic memory device according to an example embodiment of the present disclosure.

FIG. 10 is a conceptual diagram of a magnetic memory device according to an example embodiment of the present disclosure.

Referring to FIG. 10, a magnetic memory device 200 may include a selection transistor 104 and a magnetic tunnel junction 201. The magnetic tunnel junction 201 may include a tunnel insulating layer 220 interposed between a free layer 230 whose magnetization direction is switched and a pinned layer 210 whose magnetization direction is fixed. The pinned layer 210 may include a seed layer 212, a buffer layer 214 disposed on the seed layer 212, and a first pinned layer 216 disposed on the buffer layer 214. The first pinned layer 216 may include a CoFeSiB—Pd alloy thin film or a CoSiB—Pd alloy thin film. The CoFeSiB—Pd alloy thin film or the CoSiB—Pd alloy thin film of the first pinned layer 216 may maintain perpendicular magnetic anisotropy by subsequent annealing.

The selection transistor 104 may include a gate insulating layer 104b disposed on a substrate, a gate electrode 104c disposed on the gate insulating layer 104b, and impurity regions 104a formed at opposite sides adjacent to the gate insulating layer 104b. The impurity region 104a of the selection transistor 104 may be electrically connected to the magnetic tunnel junction 201. A conductivity type of the impurity region 104a may be opposite to that of a channel region below the gate insulating layer 104b. A first interlayer dielectric 106 is disposed to cover the selection transistor 104. The impurity region 104a may provide a source and a drain. A contact plug 106 may be disposed to be in contact with the impurity region 104a through the first interlayer dielectric 106. A magnetic tunnel junction may be disposed on the contact plug 104.

The magnetic tunnel junction 201 may include a pinned layer 210, a tunnel insulating layer 220, and a free layer 230 that are sequentially stacked. The pinned layer 210 may include a seed layer 212, a buffer layer 214, and a first pinned layer 216 that are sequentially stacked. The seed layer 212 may be Ta, the buffer layer 214 may be Pd, and the first pinned layer 216 may include an alloy thin film of CoFeSiB—Pd or CoSiB—Pd that are co-deposited. The first pinned layer 216 may not maintain perpendicular magnetic anisotropy in the as-deposited state and may exhibit the perpendicular magnetic anisotropy by annealing of a temperature higher than 300 degrees Celsius and lower than 600 degrees Celsius.

A tunnel insulating layer 220 may be disposed on the pinned layer 210. The tunnel insulating layer 220 may be deposited in a crystalline state by sputtering an MgO target.

A free layer 230 may be disposed on the tunnel insulating layer 220. The free layer 230 may a CoFeSiB—Pd alloy thin film or a CoSiB—Pd alloy that are co-deposited. The free layer 230 may not exhibit perpendicular magnetic anisotropy in the as-deposited state and may be polycrystallized by separate annealing of a temperature higher than 300 degrees Celsius and lower than 600 degrees Celsius to exhibit the perpendicular magnetic anisotropy. Magnetic characteristics of the free layer 230 and may be different from those of the pinned layer 216. More specifically, saturation magnetization of the first pinned layer 216 may be greater than that of the free layer 230. In addition, coercivity of the first pinned layer 216 may be greater than that of the free layer 230.

According to a modified embodiment of the present disclosure, the free layer 23 may be transformed into another material having perpendicular magnetic anisotropy.

A conductive pattern 240 may be disposed on the free layer 230. The free layer 230 contacting the conductive pattern 240 may be switched by a spin-transfer torque caused by current flowing through the magnetic tunnel junction 201. Alternatively, the free layer 230 may be switched by spin current generated by in-plane current flowing to the conductive pattern 240. Alternatively, the free layer 230 may be switched by a spin-transfer torque and a spin-orbit torque.

In the magnetic memory device 200 according to the example embodiment, the first interlayer dielectric 107 is deposited after the selection transistor 104 is formed on the substrate 102. A top surface of the first interlayer dielectric 107 may be planarized. A contact hole in which the contact plug 106 is to be disposed is formed by performing a patterning process on the first interlayer dielectric 107. After a conductor filling the contact hole is buried in the substrate 102 where the contact hole is formed, a contact plug 106 may be formed by an etch-back process.

A pinned layer 210, a tunnel insulating layer 220, and a free layer 230 are sequentially formed on the first interlayer dielectric 107. The pinned layer 210, the tunnel insulating layer 220, and the free layer 230 are patterned by a patterning process to form a magnetic tunnel junction 201. The first pinned layer 216 and the free layer 230 may exhibit perpendicular magnetic anisotropy through annealing performed once on the substrate 102 where the magnetic tunnel junction 201 is formed.

Figure 11:
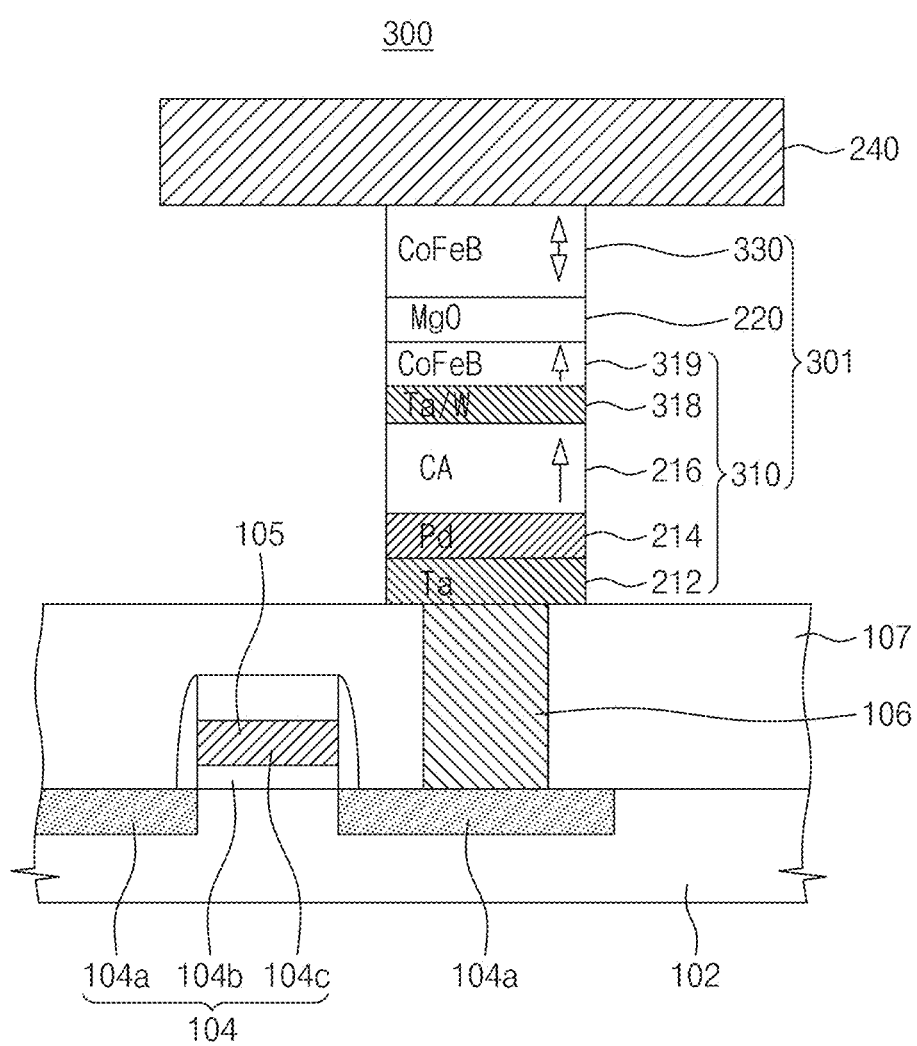
FIG. 11 is a conceptual diagram of a magnetic memory device according to another example embodiment of the present disclosure.

FIG. 11 is a conceptual diagram of a magnetic memory device according to another example embodiment of the present disclosure.

Referring to FIG. 11, a magnetic memory device 300 may include a selection transistor 104 and a magnetic tunnel junction 301. The magnetic tunnel junction 301 may include a tunnel insulating layer 220 interposed between a free layer 330 whose magnetization direction is switched and a pinned layer 310 whose magnetization direction is fixed. The pinned layer 310 may include a seed layer 212, a buffer layer 214 disposed on the seed layer 212, a first pinned layer 216 disposed on the buffer layer 214, a non-magnetic conductive layer 318 disposed on the first pinned layer 216, and a second pinned layer 319 disposed on the non-magnetic conductive layer 318. The first pinned layer 216 may include a CoFeSiB—Pd alloy thin film or a CoSiB—Pd alloy thin film. The CoFeSiB—Pd alloy thin film or the CoSiB—Pd alloy thin film of the first pinned layer 216 may exhibit perpendicular magnetic anisotropy by subsequent annealing. The non-magnetic conducive layer 318 may be Ta or tungsten (W). The second pinned layer 319 may be amorphous CoFeB having perpendicular magnetic anisotropy after subsequent annealing. The first pinned layer 216 may have the same magnetization direction as a second pinned layer 319. The non-magnetic conductive layer 318 may be Ta or W of 0.4 to 0.6 nm. The second pinned layer 319 may be CoFeB of about 1 nm.

Conventionally, in the case where amorphous CoFeB is used as a magnetic layer, when annealing of 300 degrees Celsius or more is performed to exhibit perpendicular magnetic anisotropy, the amorphous CoFeB is crystallized. When annealing of 400 degree Celsius or more is performed, the crystallized CoFeB loses the perpendicular magnetic anisotropy.

However, in the case where a structure including the first pinned layer 216, the non-magnetic conductive layer 318, and the second pinned layer 319 is used, when annealing of 300 to 600 degrees Celsius is performed, the first pinned layer 216 (or CoSiB—Pd alloy thin film) exhibits perpendicular magnetic anisotropy and the second pinned layer 319 (or CoFeB) maintains perpendicular magnetic anisotropy.

A tunnel insulating layer 220 may be disposed on the second pinned layer 319. The tunnel insulating layer 320 may be formed by sputter-deposition and may be MgO of about 1 nm having crystallinity in the as-deposited state.

A free layer 330 is disposed on the tunnel insulating layer 220. The free layer 330 may be CoFeB. Thus, the magnetic tunnel junction 301 may maintain a high TMR value caused by a CoFeB/MgO/CoFeB structure.

According to an example embodiment of the present disclosure, after the first pinned layer 216 and the second pinned layer 319 are formed, they may be annealed. Thus, the first pinned layer 216 may exhibit perpendicular magnetic anisotropy and the second pinned layer 319 may maintain perpendicular magnetic anisotropy. Moreover, after the free layer 330 is formed, separate annealing may be performed for the free layer 300 that is in an amorphous state. A temperature of the separate annealing may be lower than that of annealing for providing perpendicular magnetic anisotropy to the first pinned layer 216.

As described above, a magnetic layer according to an example embodiment of the present disclosure may easily implement perpendicular magnetic anisotropy by using a CoFeSiB—Pd alloy thin film. The CoFeSiB—Pd alloy thin film may maintain perpendicular magnetic anisotropy after annealing and may exhibit constant saturation magnetization irrespective of high squareness, high perpendicular anisotropy energy, and annealing temperature.

Although the present disclosure and its advantages have been described in detail, it should be understood that various changes, substitutions and alterations can be made herein without departing from the spirit and scope of the disclosure as defined by the following claims.

What is claimed is:

1. A method for forming a CoFeSiB—Pd alloy thin film exhibiting perpendicular magnetic anisotropy, the method comprising:
   simultaneously sputtering a CoFeSiB target and a Pd target inside a vacuum chamber to form a CoFeSiB—Pd alloy thin film of an amorphous structure without exhibiting perpendicular magnetic anisotropy as-deposited on a substrate disposed inside the vacuum chamber; and
   annealing the substrate, on which the CoFeSiB—Pd alloy thin film of an amorphous structure without exhibiting perpendicular magnetic anisotropy is formed, to change from the amorphous structure to a polycrystalline structure for exhibiting perpendicular magnetic anisotropy;
   wherein the method further comprises forming a buffer layer before forming the CoFeSiB—Pd alloy thin film and forming a seed layer before forming the buffer layer, wherein the buffer layer is Pd having a thickness of 3 nm or more, wherein a temperature of annealing the substrate, on which the CoFeSiB—Pd alloy thin film is formed, is higher than 300 degrees Celsius and lower than 600 degrees Celsius, and wherein an inter-diffusion of Pd elements occurs between the CoFeSiB—Pd alloy thin film and the buffer layer during the annealing.

2. The method as set forth in claim 1, further comprising:
   forming a capping layer after forming the CoFeSiB—Pd alloy thin film.

3. The method as set forth in claim 1, wherein the CoFeSiB—Pd alloy thin film is formed by dc sputtering using the CoFeSiB target and the Pd target.

4. The method as set forth in claim 3, wherein a composition ratio of the CoFeSiB target is $Co_xFe_ySi_{15}B_{10}$ (atomic percent) where x=70.5~75 and y=4.5~0.

5. The method as set forth in claim 3, wherein the CoFeSiB—Pd alloy thin film is deposited under an atmosphere of argon and an atmosphere of 1 mTorr to 10 mTorr.

6. The method as set forth in claim 1, wherein a volume ratio of CoFeSiB to Pd is 1:1.6 to 1:7.

7. The method as set forth in claim 1, wherein a squareness of the CoFeSiB—Pd alloy thin film exhibiting the perpendicular magnetic anisotropy is 90 percent or more,
   saturation magnetization of the CoFeSiB—Pd alloy thin film is 200 emu/cm$^3$ or more, and
   magnetic anisotropy energy is $1.53 \times 10^6$ erg/cm$^3$ or more.

8. A method to form a CoSiB—Pd alloy thin film exhibiting perpendicular magnetic anisotropy, the method comprising:
   simultaneously sputtering a CoSiB target and a Pd target inside a vacuum chamber to form a CoSiB—Pd alloy thin film of an amorphous structure without exhibiting perpendicular magnetic anisotropy on a substrate disposed inside the vacuum chamber; and
   annealing the substrate, on which the CoSiB alloy thin film of an amorphous structure without exhibiting perpendicular magnetic anisotropy is formed, to change from the amorphous structure to a polycrystalline structure for exhibiting perpendicular magnetic anisotropy;

wherein the method further comprises forming a buffer layer before forming the CoSiB—Pd alloy thin film and forming a seed layer before forming the buffer layer, wherein the buffer layer is Pd having a thickness of 3 nm or more, wherein a temperature of annealing the substrate, on which the CoSiB—Pd alloy thin film is formed, is higher than 300 degrees Celsius and lower than 600 degrees Celsius, and wherein an interdiffusion of Pd elements occurs between the CoFeSiB—Pd alloy thin film and the buffer layer during the annealing.

9. The method as set forth in claim 8, further comprising:

forming a capping layer after forming the CoSiB—Pd alloy thin film.

10. The method as set forth in claim 8, wherein the CoSiB—Pd alloy thin film is formed by dc sputtering using the CoFeSiB target and the Pd target.

11. The method as set forth in claim 10, wherein a composition ratio of the CoSiB target is $Co_{75}Si_{15}B_{10}$ (atomic percent).

12. The method as set forth in claim 10, wherein the CoSiB—Pd alloy thin film is deposited under an atmosphere of argon and an atmosphere of 1 mTorr to 10 mTorr.

13. The method as set forth in claim 8, wherein a volume ratio of CoSiB to Pd is 1:1.6 to 1:7.

* * * * *